(12) United States Patent
Tay et al.

(10) Patent No.: US 6,706,643 B2
(45) Date of Patent: Mar. 16, 2004

(54) UV-ENHANCED OXY-NITRIDATION OF SEMICONDUCTOR SUBSTRATES

(75) Inventors: Sing-Pin Tay, Fremont, CA (US); Yao Zhi Hu, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 10/041,552

(22) Filed: Jan. 8, 2002

(65) Prior Publication Data

US 2003/0148628 A1 Aug. 7, 2003

(51) Int. Cl.⁷ .................. H01L 21/31; H01L 21/469
(52) U.S. Cl. .................. 438/771; 438/287; 438/770
(58) Field of Search .................. 438/287, 770, 438/771, 776, 792, 795

(56) References Cited

U.S. PATENT DOCUMENTS

| | | | |
|---|---|---|---|
| 4,509,451 A | 4/1985 | Collins et al. | |
| 4,581,622 A | 4/1986 | Takasaki et al. | |
| 4,702,936 A | * 10/1987 | Maeda et al. ............... | 427/54.1 |
| 5,178,682 A | 1/1993 | Tsukamoto et al. | |
| 5,578,848 A | 11/1996 | Kwong et al. | |
| 5,634,107 A | 5/1997 | Yumoto et al. | |
| 5,643,838 A | * 7/1997 | Dean et al. .................. | 437/238 |
| 6,020,024 A | 2/2000 | Maiti et al. | |
| 6,121,130 A | 9/2000 | Chua et al. | |
| 6,153,504 A | 11/2000 | Shields et al. | |
| 6,291,866 B1 | 9/2001 | Wallace et al. | |
| 6,291,867 B1 | 9/2001 | Wallace et al. | |
| 6,326,231 B1 | 12/2001 | Subramanian et al. | |
| 6,451,713 B1 | * 9/2002 | Tay et al. .................. | 438/791 |

FOREIGN PATENT DOCUMENTS

| | | |
|---|---|---|
| EP | 0 227 839 | 7/1987 |
| EP | 0886308 A | 12/1998 |
| EP | 1030352 | 2/2000 |
| JP | 01152631 | 6/1989 |
| WO | WO-0145501 A | 6/2001 |

OTHER PUBLICATIONS

Rosato, J.J. et al. "Ultra–high Capacitance Nitride Films Utilizing Passivation on Rugged Polysilicon" *J. Electrochem Soc.*, Manchester, NH, vol. 139, No. 12 (Dec. 1, 1992).

Y. Hu, et al., "Real Time Investigation of Nucleation and Growth of Silicon on Silicon Dioxide Using Silane and Disilane in a Rapid Thermal Processing System," *J. Vac Sci Technol.* B14 (2) Mar./Apr. 1996 pp. 744–749.

M. Copel, et al. "Nucleation of Chemical Vapor Deposited Silicon Nitride on Silicon Dioxide," *Applied Physics Letters* V. 74, No. 13, Mar. 29, 1999. Pp. 1830–1832.

(List continued on next page.)

*Primary Examiner*—Alexander Ghyka
(74) *Attorney, Agent, or Firm*—Connolly Bove Lodge & Hutz LLP

(57) ABSTRACT

The oxynitride or oxide layer is formed on a semiconductor substrate by subjecting the substrate to UV radiation while exposed to a gaseous atmosphere of $O_2$ and one or more of $N_2$, $N_2O$, $H_2$ and $NH_3$. Thereafter, a silicon nitride layer is formed according to known 4-step gate stack dielectric processing techniques. Alternatively, a 3-step gate stack process is used, namely following UV-oxidation, a further UV-radiation in $NH_3$ may be applied, followed by a rapid thermal anneal process in an inert ambient. By using UV-oxidation as the first step in either a 4-step or 3-step gate stack process, very thin composite dielectric films with equivalent oxide thickness (EOT) below 16 Å and as low as 14.2 Å can be obtained with significant improvement in leakage current density.

17 Claims, 2 Drawing Sheets

OTHER PUBLICATIONS

H. Reisinger, et al., "Electrical Breakdown Induced By Silicon Nitride Roughness in Thin Oxide–Nitride–Oxide Films," *J. Applied Physics*, V. 79., No. 6, pp. 3028–3035 (Mar. 15, 1996).

Hu, et al., "In Situ Surface Pretreament Effect on Nucleation and Film Structure of Polysilicon in a RTCVD System," $4^{th}$ Int'l Conf. Advanced Thermal Processing of Semiconductors, *RTP '96* pp. 128–135 (1996).

Lucovsky, et al., "Bonding Constraints and Defect Formation At Interfaces Between Crystalline Silicon and Advanced Single Layer and Composite Gate Dielectrics" *Applied Phys. Lett.* V. 74, No. 14 (Apr. 5, 1999).

Body, I. W., "Vacuum ultraviolet Deposition of Silicon Dielectrics" Proceeding of the 1st Intl. Symposium on Semiconductor Processing and Characterization with Lasers, No. 173–74, Apr. 18–20, 1994, pp. 81–92, Stuttgart Germany.

* cited by examiner

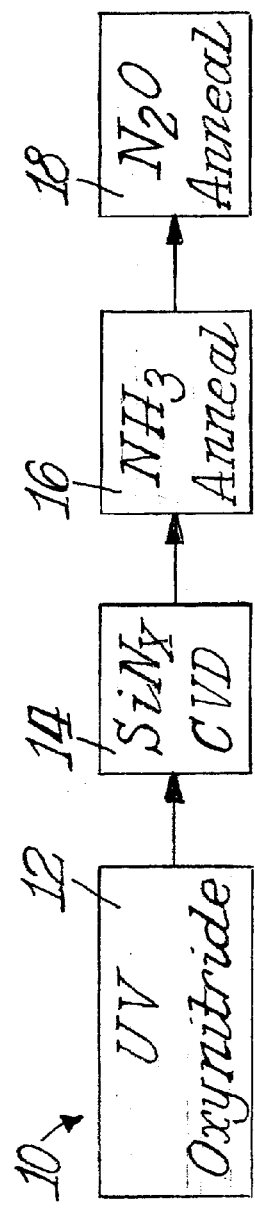
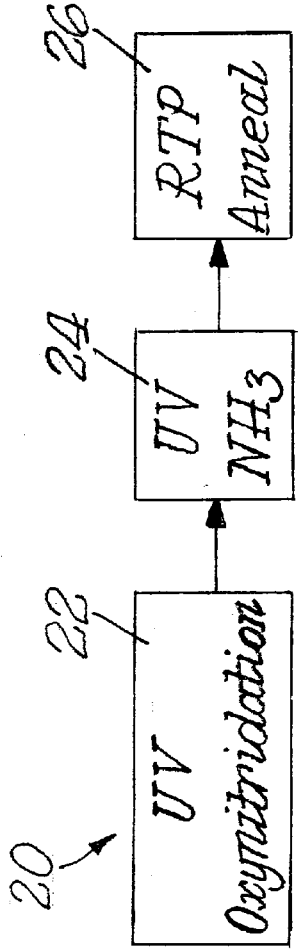

UV-ENHANCED OXY-NITRIDATION OF SEMICONDUCTOR SUBSTRATES

FIELD OF THE INVENTION

The present invention relates generally to processes for forming ultra-thin dielectric films for ULSI applications. The processes have particular advantage when used for forming oxynitride films on silicon semiconductor substrates with chemical vapor deposition (CVD) techniques.

BACKGROUND OF THE INVENTION

The current trend in integrated circuits is to use ultra thin dielectric layers when fabricating metal-oxide-semiconductors (MOS). A gate oxide layer is typically formed by thermal oxidation of a silicon semiconductor substrate in a substantially pure oxygen atmosphere. In ultra large scale integrated (ULSI) circuits, however, such gate oxide layers in the metal oxide semiconductor field effect transistor (MOSFET) can exhibit undesirable characteristics, such as relatively high defect densities and charge trapping, and relatively low reliability and low resistance to hot carrier effects. Composite oxide-nitride dielectrics have been experimented with in order to achieve very thin dielectric films with the required equivalent oxide thickness (EOT), as well as all the other qualities required to meet performance specifications. While higher nitrogen content in the oxynitride can be advantageous, it may also degrade the mobility of the transistors.

Once the semiconductor substrate surface has been cleaned, it is subjected to a series of rapid thermal heating processes (RTP) to form the multi-layer gate stack. Those processes often consist of: (1) growing an oxynitride layer with nitric oxide (NO); (2) depositing a silicon nitride ($SiN_x$) layer with a rapid thermal chemical vapor deposition (RTCVD) process; (3) rapid thermal annealing the substrate with the $SiN_x$ layer in an ammonia ($NH_3$) environment; and (4) rapid thermal annealing the substrate in an $N_2O$ environment. These four steps generally are considered standard in a 4-step gate stack dielectric growth.

The first step is the most critical. The goals of the oxynitride layer growth step are as follows: to achieve very thin EOT of the gate stack dielectric film; to grow an oxynitride layer with appropriate nitrogen content; to grow an oxynitride layer that allows good quality growth of silicon nitride applied on the oxynitride layer; and to obtain high mobility for transistors.

Most commonly, the oxynitride film is formed with a rapid thermal NO or $O_2$ oxidation in which the substrate is heated rapidly in an atmosphere of NO or $O_2$ gases for a controlled, generally short, time. When such rapid thermal NO or $O_2$ oxidation is the first step in the 4-step gate stack dielectric growth process, the EOT of dielectric films ultimately formed on the semiconductor are almost always higher than 16 angstrom (Å). In the trend for producing thinner and thinner gate stack dielectrics, thinner oxynitride layers with still good performance are required. Unfortunately, the resultant dielectric films deteriorate rapidly, i.e. the leakage current density increases dramatically, when the EOT of the oxynitride is less than 16 Å.

The surface roughness of a CVD silicon nitride film deposited on a silicon dioxide layer has been found undesirably high (i.e., root mean square (RMS) roughness of about 10 Å and even up to 20 Å) when the physical thickness of the nitride layer is about 25 Å and below. Published research papers have indicated that the coalescence of nitride nucleation islands does not take place until the silicon nitride film physical thickness exceeds about 20 Å. See H. Resinger and A. Spitzer, "Electrical Breakdown Induced by Silicon Nitride Roughness in Thin Oxide-Nitride-Oxide Films," *J. Appl. Phys.*, V. 79, p. 3028 (1996); M. Copel, et. al., "Nucleation of Chemical Vapor Deposited Silicon Nitride on Silicon Dioxide," *Appl. Phys. Lett.*, V. 74, p. 1830 (1999); and Y. Hu, et al., "An In-Situ Real Time Measurement of the Incubation Time for Si Nucleation on $SiO_2$ in a Rapid Thermal Process," *Appl. Phys. Lett.*, V. 66, p. 700 (1995). Thus, because the growth of silicon nitride films on oxide layers appears to be dependent upon having sufficient nucleation sites, thinner nitride films have had unacceptable surface roughness leading to unacceptable gate dielectric characteristics.

More recently, some studies showed that remote plasma oxidation may improve the ultra-thin oxide interface. See Lucovsky, et al., *Appl. Phys. Lett.*, V. 74, p. 2005 (1999). Unfortunately, remote plasma oxidation requires special processing equipment and is complicated to use. Alternative approaches to create more nucleation sites and reduce surface roughness of the thin silicon nitride films are still being sought. In addition, alternative approaches to create dielectric films with lower EOT and less leakage current density are still being sought.

SUMMARY OF THE INVENTION

According to the invention, an oxynitride layer is formed on a semiconductor substrate using UV-oxidation as the first step in the 4-step gate stack dielectric growth process. In contrast to the prior art rapid thermal NO or $O_2$ oxidation, in our process, the semiconductor substrate surface is simultaneously exposed to UV radiation and a gaseous atmosphere containing $O_2$ and one or more gases selected from $N_2$, $NH_3$, $N_2O$ and $H_2$. Preferably, the semiconductor substrate is silicon. Preferably, the oxynitride layer is formed on the substrate surface by exposing the substrate surface both to (1) UV radiation (from about 50% to 100% power of a maximum power of 200 Watt, preferably 70% power) and (2) the gaseous atmosphere for about 30 to 90 seconds (preferably 60 seconds), at a temperature of about 100 to 150° C. (preferably 130° C.) and at a pressure of about 80 to 120 Torr (preferably 100 Torr). Preferably, the $O_2$ gas is introduced at a flow rate of about 100 to 500 SCCM (Standard Cubic Centimeters per Minute), and the $N_2$, $NH_3$, $N_2O$ and/or $H_2$ gas is introduced at a flow rate of about 2,000 to 3,000 SCCM, with the $O_2$ gas comprising less than about 20% of the mixture in the gaseous atmosphere. Most preferably, the gaseous atmosphere consists of $O_2$ and $N_2$ gases, with the $O_2$ gas about 2 to 12% of the mixture in the gaseous atmosphere.

After the oxynitride layer is applied by UV-oxidation according to the invention, the remaining steps of the known 4-step gate stack process are carried out. A silicon nitride layer is applied onto the oxynitride layer, frequently using chemical vapor deposition. The substrate with $SiN_x$ layer is annealed in the presence of a $NH_3$ atmosphere and then further annealed in the presence of a $N_2O$ atmosphere.

In an alternate preferred embodiment, the semiconductor substrate surface is simultaneously exposed to UV radiation and a gaseous atmosphere containing $O_2$ and one or more gases selected from $N_2$, $NH_3$, $N_2O$ and $H_2$. After an oxynitride layer is formed, the semiconductor substrate is exposed to UV radiation and a gaseous atmosphere containing $NH_3$. The $NH_3$ is introduced at a flow rate of about 0.2 to 1.0

SLPM (Standard Liters Per Minute), at a temperature in the range of about 100 to 200° C. (preferably 150° C.) and at a pressure in the range of about 10 to 200 Torr (preferably 100 Torr). UV radiation is applied at a power setting of about 50% to 100% power of a maximum power of 200 Watt (preferably 70% power) for about 2 to 30 seconds. The substrate is then annealed using a rapid thermal process in inert ambient (preferably $N_2$ at a flow rate of 0.5 to 2 SLPM) at a temperature in the range of about 800 to 1000° C. and for a time of about 30 to 60 seconds.

We have found that by using UV-oxidation as the first step in the 4-step (e.g., FIG. 1) gate stack dielectric growth process, one can obtain composite dielectric films with EOT values below 16 Angstrom (Å), and as low as 14.2 Å. The associated leakage current densities of the resulting dielectric films are also very low, on the order of 1.0E-01 A/cm². This is more than one order of magnitude lower than that extrapolated from the prior art (solid line in FIG. 3).

The ITRS (International Technology Roadmap for Semiconductors) specifications demand that, for the 100 nm technology node the gate dielectric EOT shall be 10 Å thick with leakage current density less than 1.0 A/cm². It is expected that the 3-step process (e.g., FIG. 2) will yield the same or better quality dielectric. The process thus improves the quality of the dielectric films formed on the semiconductor substrate surface.

BRIEF DESCRIPTION OF THE DRAWINGS

FIG. 1 is a schematic flow chart of a 4-step gate stack dielectric growth process according to a first embodiment of the invention;

FIG. 2 is a schematic flow chart of a 3-step gate stack dielectric growth process according to an alternate embodiment of the invention.

DETAILED DESCRIPTION OF PREFERRED EMBODIMENTS

Figure 3:
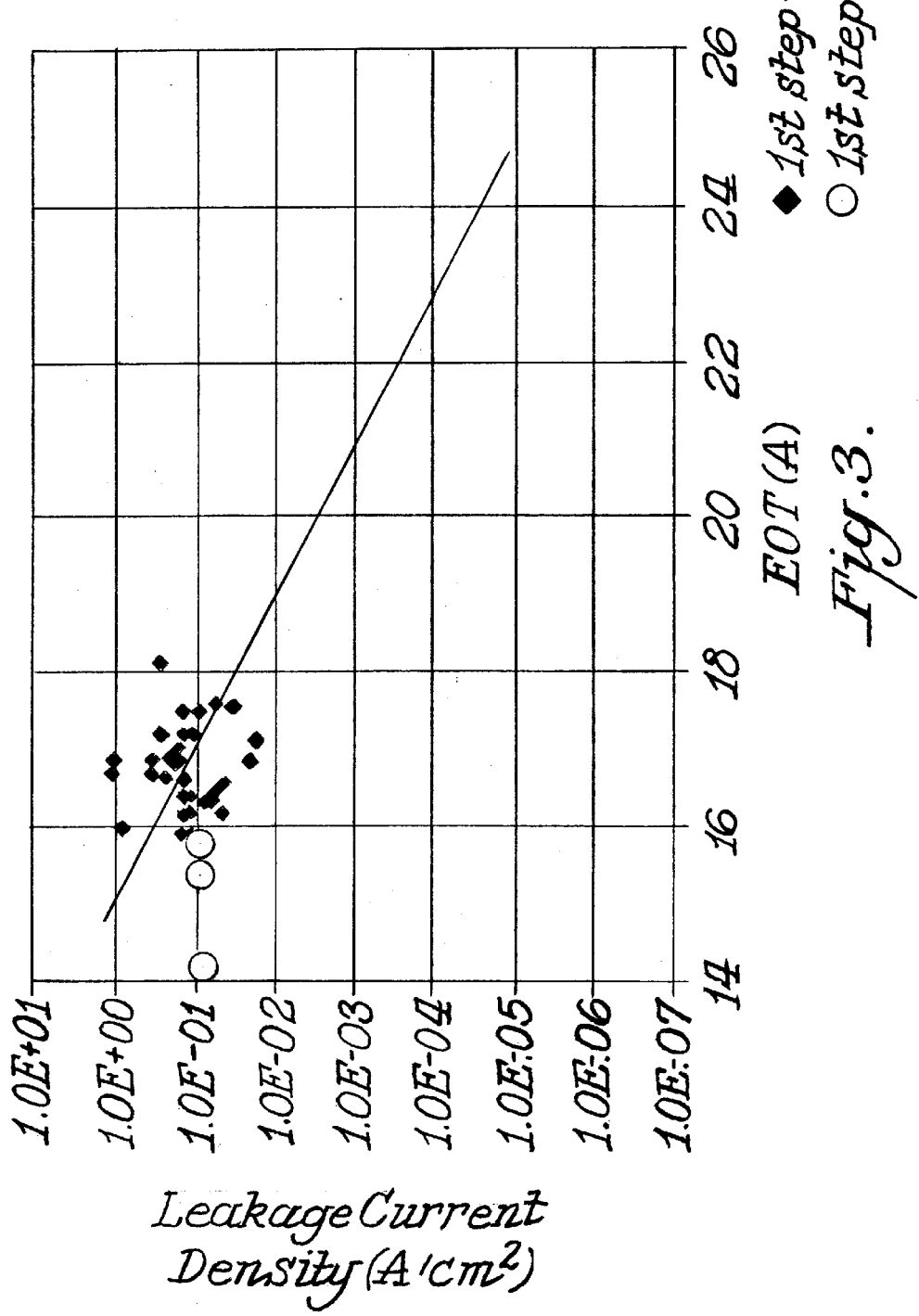
FIG. 3 is a graph comparing leakage current density with equivalent oxide thickness (EOT) for the gate stack dielectric films formed (i) when UV-oxidation is used to apply the oxynitride layer and (ii) when conventional rapid thermal processing is used to apply the oxynitride layer.

FIG. 1 depicts in schematic form the process according to the invention. In one embodiment of the process 10, the first step 12 of 4-step gate stack processing comprises oxynitride formation with UV-oxidation. The second step 14 comprises depositing a silicon nitride layer over the oxynitride layer using a rapid thermal chemical vapor deposition (CVD) process. The third step 16 comprises annealing the semiconductor substrate while the substrate is exposed to a gaseous atmosphere of $NH_3$. The fourth step 18 comprises further annealing the semiconductor substrate while the substrate is exposed to a gaseous atmosphere of $N_2O$.

According to the invention, a semiconductor substrate (preferably a silicon semiconductor substrate) is simultaneously exposed to UV radiation and a gaseous atmosphere containing $O_2$ and one or more gases selected from $N_2$, $NH_3$, $N_2O$ and $H_2$, in order to oxidize the silicon surface. The oxynitride thickness is estimated to be ordinarily about 6 Å based on analysis of ellipsometric and electrical data of the final gate stack. In the preferred embodiment, UV radiation is emitted from an external Xenon lamp with a broad wavelength (200–1100 nm) output. Preferably, the photon energies from such Xenon lamp are 6.2–1.1 eV, which are higher than most bond energies for semiconductor substrates, such as: Si—Si=3.1 eV; Si—H=3.0 eV; Si—Cl=3.9 eV; Si—N=4.0 eV; Si—O=4.6 eV. These bonds can be dissociated under UV radiation, but they should not be ionized because their ionization potentials far exceed 10 eV.

The preferred process includes the following steps:
(1) optionally dry clean the surface of the semiconductor substrate, preferably a silicon semiconductor substrate, with UV-excited ozone to remove organic residues, then apply an HF-methanol vapor treatment to remove any grown oxide, and then use UV-excited chlorine to remove metallic contaminants;
(2) expose the semiconductor substrate surface, for about 30 to 90 seconds, most preferably 60 seconds, to gaseous $O_2$ at a flow rate of about 100 to 500 SCCM mixed with one or more gases selected from $N_2$, $NH_3$, $N_2O$ and $H_2$ at a flow rate of about 2,000 to 3,000 SCCM. The $O_2$ gas should be less than 20% mixture in the gaseous atmosphere. Most preferably, the gaseous mixture is $O_2$ and $N_2$, with the $O_2$ comprising about 2 to 12% mixture in the gaseous atmosphere. UV radiation preferably is applied at a power setting of about 50 to 100% of a maximum power of 200 Watt, most preferably 70%, at a pressure of about 80 to 120 Torr, most preferably 100 Torr. The temperature in the atmosphere should be about 100 to 150° C., most preferably 130° C., to thermally grow an oxynitride layer;
(3) deposit a film of silicon nitride over the oxynitride layer using a chemical vapor deposition (CVD) process;
(4) anneal the substrate in the presence of a $NH_3$ atmosphere; and
(5) further anneal the substrate in the presence of a $N_2O$ atmosphere.

FIG. 2 depicts in schematic form an alternate process according to the invention. In this alternate embodiment 20 the first step 22 of the gate stack processing comprises oxynitride formation with UV-oxidation. The second step 24 comprises exposing the semiconductor substrate to UV radiation and a gaseous atmosphere of $NH_3$. The third step 26 comprises annealing the semiconductor substrate using rapid thermal processing (RTP) in an inert ambient, e.g., $N_2$ gas.

The alternate preferred process includes the following steps:
(1) optionally dry clean the surface of the semiconductor substrate, preferably a silicon semiconductor substrate, with UV-excited ozone to remove organic residues, then apply an HF-methanol vapor treatment to remove any grown oxide, and then use UV-excited chlorine to remove metallic contaminants;
(2) expose the semiconductor substrate surface, for about 30 to 90 seconds, most preferably for 60 seconds, to gaseous $O_2$ at a flow rate of about 100 to 500 SCCM mixed with one or more gases selected from $N_2$, $NH_3$, $N_2O$ and $H_2$ at a flow rate of about 2,000 to 3,000 SCCM. The $O_2$ should be less than 20% of the gas mixture in the gaseous atmosphere. Most preferably, the gaseous mixture is $O_2$ and $N_2$, with the $O_2$ comprising about 5 to 12% of the mixture. UV radiation is applied at a power setting of about 50 to 100% of a maximum power of 200 Watt, most preferably 70%. The atmosphere is maintained at a pressure of about 80 to 120 Torr, most preferably 100 Torr, and at a temperature of about 100 to 150° C., most preferably 130° C., to thermally grow an oxynitride layer;
(3) expose the semiconductor substrate surface, for about 2 to 30 seconds, to gaseous $NH_3$ at a flow rate of about 0.2 to 1.0 SLPM and UV radiation at a power setting of about 50 to 100% of a maximum power of 200 Watt, most preferably 70%, at a pressure of about 10 to 200 Torr, most preferably 100 Torr, and at a temperature of about 100 to 200° C., preferably 150° C.;

(4) anneal the semiconductor substrate for about 30 to 60 seconds, using a rapid thermal process (RTP) in inert ambient, most preferably $N_2$ gas, where annealing is carried out at a temperature of about 800 to 1000° C.

With this process, dielectric films formed on the semiconductor substrate have substantially improved quality. Composite dielectric films with EOT values below 16 Å, and even as a low as 14.2 Å, are obtained. The associated leakage current densities of the resulting dielectric films are also very low, on the order of 1.0E-01 $A/cm^2$. The process according to the invention has been found to reduce the surface roughness of the resultant nitride films, thus improving the gate dielectric characteristics of such films.

Experiments were conducted to compare the processes according to the invention with known processes. The results of these experiments are shown below in Table I.

TABLE I

| Example | O2 (150°C, 100T, 1000 SCCM, 60s) | O2/N2 (150°C, 100T, 200 SCCM O2/3200 SCCM N2, 60s) | O2/N2 (150°C, 100T, 100 SCCM O2/5000 SCCM N2, 60s) | NO (800°C, 100T, 2 slm, 10s) | SiN (750°C, 1.5T, 25s) | SiN (800°C, 1.5T, 25s) | NH3 (900°C, 50T, 10 slm, 30s) | NH3 (900°C, 150T, 10 slm, 30s) | NH3 (900°C, 350T, 10 slm, 30s) | NH3 (900°C, 450T, 10 slm, 30s) | NH3 (900°C, 450T, 5.5 slm, 30s) | N2O (800°C, 50T, 18 slm, 30s) | N2O (800°C, 450T, 18 slm, 30s) | N2O (800°C, 450T, 8 slm, 30s) | Vfb (V) | hysteresis (mV) | EOT (Å) mean | C (pF) @ -2.5 V | Jg(A/cm2) @ Vg = -1.5 V | |
|---|---|---|---|---|---|---|---|---|---|---|---|---|---|---|---|---|---|---|---|---|
| 1 | x | | | | x | | | | | | x | | | x | -1.12 | 12.2 | 15.8 | 91.8 | .084 | O2 as first oxide |
| 2 | | | x | | x | | | | | | x | | | x | -1.08 | 11.3 | 15.4 | 93.5 | .088 | O2/N2 as first oxide |
| 3 | | x | | | x | | | | | | x | | | x | -1.11 | 9.4 | 14.2 | 99.8 | .083 | O2/N2 as first oxide |
| C1 | | | | x | x | | x | | | | | | | x | -1.09 | 6.8 | 16.8 | 86.5 | .021 | standard |
| C2 | | | | x | x | | x | | | | | | | x | -1.09 | 6.0 | 17.1 | 85.2 | .017 | standard |
| C3 | | | | x | x | x | | | | | | x | | | -1.06 | 11.7 | 16.4 | 90.2 | .130 | standard/fast ramp |
| C4 | | | | x | x | x | | | | | | x | | | -1.06 | 11.2 | 16.6 | 89.2 | .130 | standard/fast ramp |
| C5 | | | | x | x | x | | | | | | x | | | -1.05 | 10.9 | 16.2 | 91.5 | .170 | P2(NO + CVD + NH3) − P3(N2O) |
| C6 | | | | x | x | x | | | | | | x | | | -1.04 | 10.8 | 16.8 | 87.9 | .152 | P2(NO + CVD + NH3) − P3(N2O) |
| C7 | | | | x | x | x | | | | | | | x | | -1.04 | 10.5 | 16.8 | 88.1 | .158 | P2(NO + CVD + NH3) − P3(N2O) |
| C8 | | | | x | x | x | | | | | | | | | | | | | | |
| C9 | | | | x | x | | | | x | | | | | | | | | | | |
| C10 | | | | x | x | | | | x | | | | | | | | | | | |
| C11 | | | | x | x | | | | x | | | | | | | | | | | |
| C12 | | | | x | x | | | | x | | | | | | | | | | | |
| C13 | | | | x | x | | | | x | | | | | | | | | | | |
| C14 | | | | x | x | | | | x | | | | | | | | | | | |
| C15 | | | | x | x | | | | x | | | | | | | | | | | |
| C16 | | | | x | x | | | | x | | | | | | | | | | | |
| C17 | | | | x | x | | | | x | | | | | | | | | | | |
| C18 | | | | x | x | | | | x | x | | | | | | | | | | |
| C19 | | | | x | x | | | | x | x | | | | | | | | | | |
| C20 | | | | x | x | | | | x | | | x | | | | | | | | |
| C21 | | | | x | x | | | | x | | | x | | | | | | | | |
| C22 | | | | x | | x | | | | | | x | | | | | | | | |
| C23 | | | | x | | x | | | | | | x | | | | | | | | |
| C24 | | | | x | | x | | | x | | | | | | | | | | | |
| C25 | | | | x | | x | | | x | | | | | | | | | | | |
| C26 | | | | x | | x | x | | | | | | | | | | | | | |
| C27 | | | | x | | x | x | | | | | | | | | | | | | |
| C28 | | | | x | | x | x | | | | | | | | | | | | | |
| C29 | | | | x | | x | | | | | | | | | | | | | | |
| C30 | | | | x | | x | | | | | | | | | | | | | | |
| C31 | | | | x | | x | | | | | | | | | | | | | | |
| C32 | | | | x | | x | | | | x | | | | | | | | | | |
| C33 | | | | x | | x | | | | x | | | | | | | | | | |
| C34 | | | | x | | x | | | | x | | | | | | | | | | |

TABLE I-continued

| | | | | | | | | |
|---|---|---|---|---|---|---|---|---|
| C8 | | | x | −1.04 | 8.2 | 17.0 | 87.2 | .116 | P2(NO + CVD + NH3) − P3(N2O) |
| C9 | | x | | −1.02 | 5.9 | 16.2 | 89.7 | .068 | P3(NO)—P2(CVD) − P3(NH3 + N2O) |
| C10 | | x | | −1.05 | 7.4 | 16.3 | 89.7 | .076 | P3(NO)—P2(CVD) − P3(NH3 + N2O) |
| C11 | | x | | −1.06 | 8.8 | 16.4 | 89.3 | .066 | P3(NO)—P2(CVD) − P3(NH3 + N2O) |
| C12 | | x | | −1.06 | 7.9 | 16.3 | 89.5 | .061 | P3(NO)—P2(CVD) − P3(NH3 + N2O) |
| C13 | | x | | −1.07 | 8.3 | 16.5 | 88.8 | .054 | P3(NO)—P2(CVD) − P3(NH3 + N2O) |
| C14 | | x | | −1.06 | 13.3 | 17.6 | 85.1 | .054 | P3(NO)—P2(CVD) − P3(NH3 + N2O) |
| C15 | | x | | −1.05 | 9.0 | 17.2 | 86.7 | .109 | P3(NO)—P2(CVD) − P3(NH3 + N2O) |
| C16 | x | | | −1.07 | 13.0 | 17.5 | 85.5 | .142 | P3(NO)—P2(CVD) − P3(NH3 + N2O) |
| C17 | x | | | −1.63 | 5.9 | 17.5 | 85.4 | .092 | P3(NO)—P2(CVD) − P3(NH3 + N2O) |
| C18 | | | | −1.05 | 24.0 | 18.1 | 84.2 | .267 | P3(NO)—P2(CVD) − P3(NH3 + N2O) |
| C19 | | | | −1.09 | 22.0 | 16.7 | 90.8 | .346 | P3(NO)—P2(CVD) − P3(NH3 + N2O) |
| C20 | | | | −1.23 | 25.0 | 16.9 | 92.4 | .001 | P3(NO)—P2(CVD) − P3(NH3 + N2O) |
| C21 | | | | −1.25 | 16.3 | 16.7 | 93.0 | .001 | P3(NO)—P2(CVD) − P3(NH3 + N2O) |
| C22 | | | x | −1.07 | 7.7 | 17.5 | 83.6 | .034 | P3(NO)—P2(CVD) − P3(NH3 + N2O) |
| C23 | | | x | −1.04 | 12.5 | 17.2 | 86.9 | .139 | P3(NO)—P2(CVD) − P3(NH3 + N2O) |
| C24 | | | x | −1.04 | 14.1 | 16.6 | 90.0 | .234 | P3(NO)—P2(CVD) − P3(NH3 + N2O) |
| C25 | | | x | −1.04 | 13.9 | 16.9 | 88.1 | .208 | P3(NO)—P2(CVD) − P3(NH3 + N2O) |
| C26 | | | x | −1.04 | 16.8 | 16.9 | 89.5 | .317 | P3(NO)—P2(CVD) − P3(NH3 + N2O) |
| C27 | | | x | −1.03 | 15.4 | 17.2 | 87.8 | .286 | P3(NO)—P2(CVD) − P3(NH3 + N2O) |
| C28 | | x | | −1.31 | 19.2 | 16.0 | 97.4 | .808 | P3(NO)—P2(CVD) − P3(NH3 + N2O) |
| C29 | x | | x | −0.09 | 10.0 | 15.9 | 93.0 | .109 | P3(NO)—P2(CVD) − P3(NH3 + N2O) |
| C30 | x | | x | −1.01 | 16.8 | 16.4 | 91.2 | .113 | P3(NO)—P2(CVD) − P3(NH3 + N2O) |
| C31 | x | | x | −0.97 | 13.4 | 15.9 | 92.3 | .145 | P3(NO)—P2(CVD) − P3(NH3 + N2O) |
| C32 | | | x | −0.97 | 5.9 | 16.2 | 89.8 | .044 | P2(NO + CVD) + P3(NH3 + N2O) |
| C33 | | | x | −0.98 | 11.2 | 16.5 | 89.0 | .052 | P2(NO + CVD) + P3(NH3 + N2O) |
| C34 | | | x | −0.90 | 9.8 | 16.6 | 88.1 | .043 | P2(NO + CVD) + P3(NH3 + N2O) |

Examples 1, 2 and 3 were carried out according to the invention. In Example 1, after pre-cleaning the semiconductor substrate surface with a wet process of RCA and an HF dip a treatment, a gaseous mixture was introduced to begin the gate stack processing. The $O_2$ gas stream was introduced for 60 seconds at a temperature of 150° C. and pressure of 100 Torr at a rate of 1000 SCCM. A film of silicon nitride was then deposited over the oxynitride layer using a chemical vapor deposition (CVD) process at a temperature of 750° C. and pressure of 1.5 Torr for 25 seconds. The substrate was then annealed in an $NH_3$ atmosphere, the $NH_3$ gas stream introduced for 30 seconds at a temperature of 900° C. and a pressure of 450 Torr at a rate of 5.5 slm. Finally, the substrate was annealed in a $N_2O$ atmosphere; the $N_2O$ gas stream was introduced for 30 seconds at a temperature of 800° C. and pressure of 450 Torr at a rate of 8 slm. UV radiation emitted from a Xenon lamp was applied for 10 seconds at a power setting of 70% (maximum power 200 Watt) to thermally grow an oxide layer on the semiconductor substrate surface as the surface was exposed to the $O_2$ atmosphere. The resulting EOT was determined by capacitance measurement (a C-V measurement technique known to persons of skill in the art) to be 15.79 Å (mean). Other parameters for Example 1 are set forth in Table I.

Examples 2 and 3 were carried out similarly to Example 1, except that in Examples 2 and 3, the $O_2$ was introduced as a mixture with $N_2$ to grow the oxide layer. In Example 2, such mixture was introduced at 150° C. and at a pressure of 100 Torr at a rate of 100 SCCM $O_2$ to 5000 SCCM $N_2$. In Example 3, such mixture was introduced at 150° C. and at a pressure of 100 Torr at a rate of 200 SCCM $O_2$ to 3200 SCCM $N_2$. The EOT for Example 3 was 14.2 Å and for Example 2 was 15.37 Å.

FIG. 3 shows graphically the results from the representative Examples reported in Table I. In FIG. 3, leakage current density (in $A/cm^2$) is plotted against EOT (in Å) of the dielectric films in which the oxynitride layers are formed by (i) RT-NO oxidation and (ii) the novel UV-oxidation process. It is clear that UV-oxidation as the first step in the 4-step gate stack process produces dielectric films that have both lower EOT values (as low as 14.2 Å) and lower leakage current densities than dielectric films formed by using RT-NO oxidation as the first step in the 4-step gate stack process. The experimental results also show the excellent uniformity of the dielectric films formed by using the novel UV-oxidation process as the first step in the 4-step gate stack process.

The foregoing description of the invention illustrates and describes the preferred embodiments. Nevertheless, it is to be understood that the invention is capable of use in various other combinations, modifications, and environments, and is capable of changes or modifications within the scope of the inventive concept that has been expressed herein. The description is not intended to limit the invention to the form disclosed here. Alternate embodiments apparent to those skilled in the art are to be included within the scope of the appended claims.

We claim:

1. A process for forming an oxynitride film on the surface of a semiconductor substrate as one step in a gate stack forming process, comprising:

exposing the semiconductor substrate to a gaseous atmosphere containing $O_2$ and one or more gases selected from the group consisting of: $N_2$, $NH_3$, $N_2O$ and $H_2$; and radiating the substrate with UV radiation while the substrate is exposed to said gaseous atmosphere so that an oxynitride film forms on the surface of the substrate by oxidation of the substrate.

2. The process of claim 1, wherein the gaseous atmosphere is $O_2$ and $N_2$, and the gases are introduced at a pressure in the range of about 80 to 120 Torr and at a temperature in the range of about 100 to 150° C.

3. The process of claim 1, wherein the semiconductor substrate is radiated with UV radiation for about 30 to 90 seconds.

4. The process of claim 1, wherein the UV radiation is applied at a power setting in the range of about 50 to 100% of a maximum power of 200 Watt.

5. The process of claim 1, wherein the atmosphere comprises a mixture of $O_2$ and $NH_3$.

6. The process of claim 1, wherein the atmosphere comprises a mixture of $O_2$ and $N_2O$.

7. The process of claim 1, wherein the atmosphere comprises a mixture of $O_2$, $H_2$ and $N_2$.

8. The process of claim 1, further comprising forming a silicon nitride layer over the oxynitride film.

9. The process of claim 8, further comprising annealing the semiconductor substrate while the substrate is exposed to a gaseous atmosphere of $NH_3$.

10. The process of claim 8, further comprising annealing the semiconductor substrate while the substrate is exposed to a gaseous atmosphere of $N_2O$.

11. A process for forming an oxynitride film on the surface of a semiconductor substrate as one or more steps in a gate stack forming process, comprising:

exposing the semiconductor substrate to a gaseous atmosphere containing $O_2$ and $N_2$;

radiating the substrate with UV radiation while the substrate is exposed to said gaseous atmosphere so that an oxynitride film forms on the surface of the substrate by oxidation of the substrate;

radiating the substrate with UV radiation while the substrate is exposed to a gaseous atmosphere of $NH_3$; and annealing the substrate with a rapid thermal anneal in inert ambient.

12. The process of claim 11, wherein the $O_2$ and $N_2$ gases are introduced at a pressure in the range of about 80 to 120 Torr and at a temperature in the range of about 100 to 150° C.

13. The process of claim 11, wherein the semiconductor substrate is radiated in the gaseous atmosphere of $O_2$ and $N_2$ for about 30 to 90 seconds.

14. The process of claim 11, wherein the UV radiation is applied at a power setting in the range of about 50 to 100% of a maximum power of 200 Watt while the semiconductor substrate is exposed to $O_2$ and $N_2$ gaseous atmosphere.

15. The process of claim 11, wherein the $NH_3$ gas is introduced at a pressure in the range of about 10 to 200 Torr and at a temperature in the range of about 100 to 200° C.

16. The process of claim 11, wherein the UV radiation is applied at a power setting of about 50 to 100% of a maximum power of 200 Watt for about 2 to 30 seconds while the semiconductor substrate is exposed to $NH_3$ gas.

17. The process of claim 11, wherein the annealing is carried out at a temperature in the range of about 800 to 1000° C. for about 30 to 60 seconds.

* * * * *